(12) United States Patent
Drost et al.

(10) Patent No.: US 9,804,573 B1
(45) Date of Patent: Oct. 31, 2017

(54) USE OF REDUNDANCY IN SUB-RANGING TIME-TO-DIGITAL CONVERTERS TO ELIMINATE OFFSET MISMATCH ISSUES

(71) Applicant: Silicon Laboratories Inc., Austin, TX (US)

(72) Inventors: Brian G. Drost, Corvallis, OR (US); Ankur Guha Roy, Hillsboro, OR (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 15/394,454

(22) Filed: Dec. 29, 2016

(51) Int. Cl.
  *H03M 1/12* (2006.01)
  *G04F 10/00* (2006.01)
  *H03M 1/16* (2006.01)
  *H03M 1/18* (2006.01)

(52) U.S. Cl.
  CPC ............ *G04F 10/005* (2013.01); *H03M 1/16* (2013.01); *H03M 1/188* (2013.01)

(58) Field of Classification Search
  CPC ........ G04F 10/005; H03M 1/188; H03M 1/16
  USPC .................................................. 341/155, 156
  See application file for complete search history.

(56) References Cited

U.S. PATENT DOCUMENTS

| | | | | |
|---|---|---|---|---|
| 8,031,007 B2* | 10/2011 | Chang | .................... | H03L 7/085 331/1 A |
| 8,193,963 B2* | 6/2012 | Wang | .................... | G04F 10/005 324/76.53 |
| 8,471,736 B1* | 6/2013 | Booth | .................. | G04F 10/005 327/105 |
| 8,890,738 B2* | 11/2014 | Kim | ...................... | G04F 10/005 341/156 |

OTHER PUBLICATIONS

Cao, Y. et al., "1-1-1 MASH ΔΣ Time-to-Time Digital Converters With 6 ps Resolution and Third-Order Noise-Shaping," IEEE Journal of Solid-State Circuits, vol. 47, No. 9, Sep. 2012, pp. 2093-2106.
Kim, Y., "An 11 b 7 ps Resolution Two-Step Time-to-Digital Converter With 3-D Vernier Space," IEEE Transactions on Circuits and Systems—I: Regular Papers, vol. 61, No. 8, Aug. 2014, pp. 2326-2336.

* cited by examiner

*Primary Examiner* — Brian Young
(74) *Attorney, Agent, or Firm* — Zagorin Cave LLP

(57) ABSTRACT

A time-to-digital converter utilizes both coarse and fine quantizers and addresses mismatch by using redundant bits in the coarse time representation and the fine time representation. The redundant bits are compared and if the redundant bits are the same, no mismatch correction is required but if the redundant bits are different a correction is applied to correct the redundant portion of the coarse time information. The redundant portion includes the most significant bit generated by the fine quantizer and the least significant bit of the coarse quantizer. The correction adds to or subtracts from the redundant information.

20 Claims, 5 Drawing Sheets

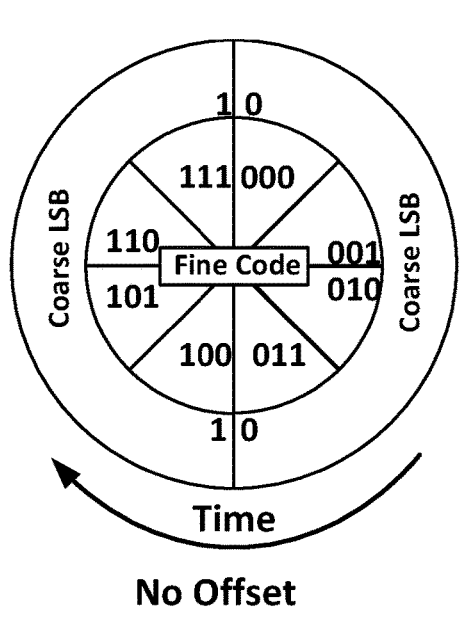
FIG. 6 No Offset
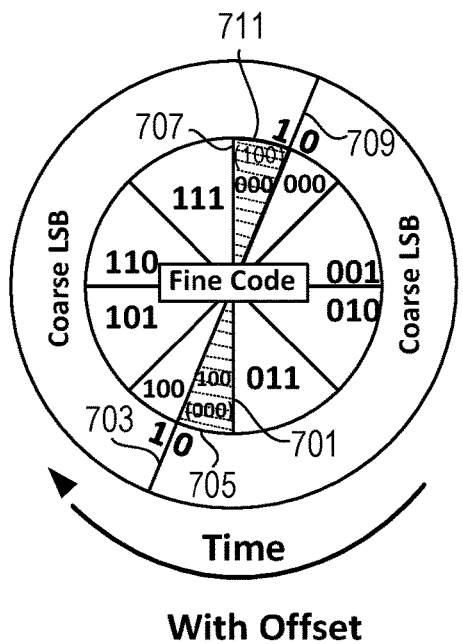
FIG. 7 With Offset
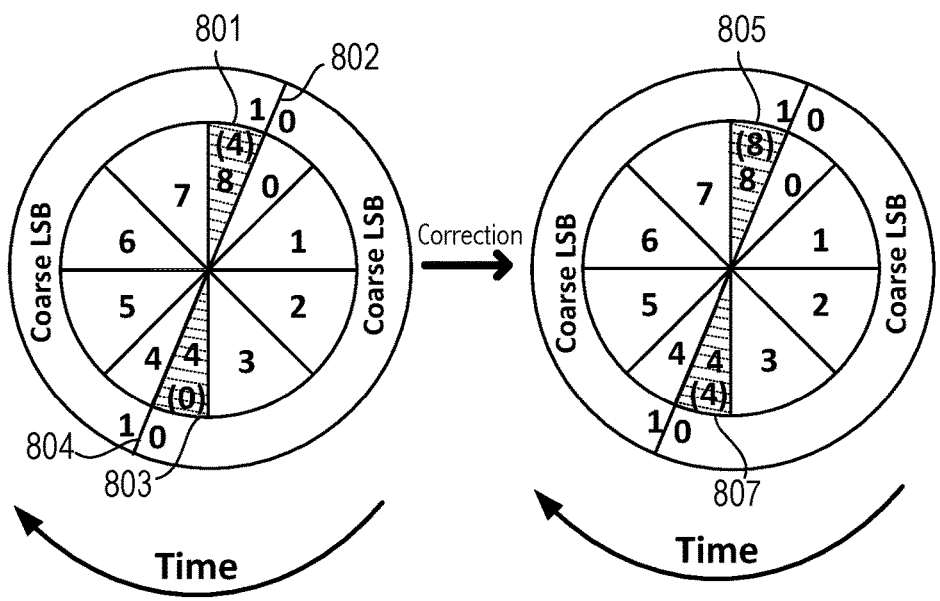
FIG. 8

USE OF REDUNDANCY IN SUB-RANGING TIME-TO-DIGITAL CONVERTERS TO ELIMINATE OFFSET MISMATCH ISSUES

BACKGROUND

Field of the Invention

This invention relates to time-to-digital converters and more particularly to addressing offset issues in time-to-digital converters.

Description of the Related Art

Time-to-digital converters (TDCs) can be found in such circuits as phase-locked loops (PLLs) and frequency-locked loops (FLLs). FIG. 1A illustrates a high level block diagram of a conventional fractional-N PLL 100 that utilizes a time-to-digital converter 101. The time-to-digital converter 101 generates a digital value corresponding to a difference between a reference clock signal 103 and a feedback clock signal 105 and supplies the digital value to digital loop filter 107. The digital loop filter controls the digitally controlled oscillator (DCO) 109 to generate an output clock signal 111.

FIG. 1B illustrates a high level block diagram of a frequency-locked loop (FLL) 150 that utilizes a frequency-to-digital converter 121, which is another type of time-to-digital converter where the time represents a frequency difference. As used herein, TDC refers to a circuit that quantizes time related information, e.g., frequency, phase, or absolute time. The frequency-to-digital converter 121 generates a digital value corresponding to a frequency difference between a reference clock signal 123 and an output clock signal 125 and supplies the digital value to digital loop filter 127. The digital loop filter controls the digitally controlled oscillator (DCO) 129 to generate the output clock signal 125 with the desired frequency.

There are generally two types of circuits useful for quantizing time that can be used in a time-to-digital converter. The first type is "counter-based" and counts the number of reference clock edges that occur during a given time. The counter-based TDC can measure arbitrarily long intervals limited only by the size of the counter, but the resolution of the counter-based TDC is limited by the clock frequency doing the counting. The second type of TDC is "pulse-based" and measures the time of a pulse by converting the pulse duration to another analog quantity (such as voltage). For example, the pulse may be used to charge a capacitor. The voltage across the capacitor may then be converted to a digital value in an analog to digital converter. The resolution of the pulse-based TDC can be reduced below a clock period, but the measurable interval is limited and usually small.

To get the advantages of both types of TDCs, counter-based time-to-digital converter and the pulse-based time-to-digital converter can be combined into a coarse-fine quantizer. The counter-based type forms the coarse quantizer and pulse-based type forms the fine quantizer. If it is functioning properly, the resolution will be the same as the fine quantizer (very good), but the range will be that of the coarse quantizer (arbitrarily large). The problem is that any mismatch in the instant at which the two quantizers take their time sample can reduce the resolution to that of the coarse quantizer, which makes implementation of such circuits problematic.

SUMMARY OF EMBODIMENTS OF THE INVENTION

Accordingly, embodiments described herein address mismatch in TDCs. In one embodiment, an apparatus includes a fine time-to-digital converter (TDC) providing fine time information with a first resolution, wherein the fine TDC is configured to roll over from a maximum value to a minimum value. A coarse time-to-digital converter (TDC) provides coarse time information with a second resolution, the second resolution more coarse than the first resolution and the second resolution is less than a range of the fine TDC such that a first portion of the fine time information and a second portion of the coarse time information overlap and provide redundancy. A compare circuit compares the first portion of the fine time information with the second portion of the coarse time information and supplies a mismatch indication in response to the first portion and the second portion not matching. A correction circuit corrects the second portion responsive to the mismatch indication.

In another embodiment, a method includes providing fine time information from a fine time-to-digital converter that rolls over from a maximum value to a minimum value and providing coarse time information from a coarse time-to-digital converter. A first portion of the fine time information and a second portion of the coarse time information are compared and a mismatch indication is supplied in response to the first portion and the second portion not being equal, wherein the first portion and the second portion overlap. The second portion is corrected responsive to the mismatch indication.

In another embodiment, a sub-ranging time-to-digital converter includes a fine time-to-digital converter that provides fine time information and a coarse time-to-digital converter that provides coarse time information. A compare circuit compares a most significant bit of the fine time information and a least significant bit of the coarse time information and supplies a mismatch indication in response to the most significant bit and the least significant bit not being equal, wherein the most significant bit and the least significant bit overlap. A correction circuit corrects the least significant bit of the coarse time information responsive to the mismatch indication.

BRIEF DESCRIPTION OF THE DRAWINGS

The present invention may be better understood, and its numerous objects, features, and advantages made apparent to those skilled in the art by referencing the accompanying drawings.

FIG. 6 illustrates how coarse and fine TDC bits work when there is no offset.

FIG. 7 illustrates a mismatch error that occurs when the coarse LSB transitions after the fine bits transition.

FIG. 8 illustrates a mismatch error that occurs when the coarse LSB transitions after the fine bits transition and the correction.

The use of the same reference symbols in different drawings indicates similar or identical items.

DETAILED DESCRIPTION

Embodiments described herein provide coarse-fine quantizers that are useful for digital-type PLLs and FLLs but more generally can be used where there is a need to quantize either time or frequency.

Historically, circuit designers have worked around the delay mismatch problem for coarse-fine quantizers. A current solution for digital PLLs is to use both types of TDCs, but have them operate separately and then switch between them. Thus, the coarse TDC can be used to provide the wide range useful for acquiring frequency lock and the fine TDC may be used to acquire and maintain the proper phase relationship. But such an approach requires loop filter circuitry for both the fine and coarse TDC and detection circuitry to know when to switch between them. In contrast, embodiments described herein provide a combined coarse-fine TDC that may be combined into a single circuit and reap the benefits of both coarse and fine topologies at the same time. That means large intervals of time can be measured with very good resolution at the same time. The existing approaches using separate TDCs can only do one or the other at any given time.

Figure 1A:
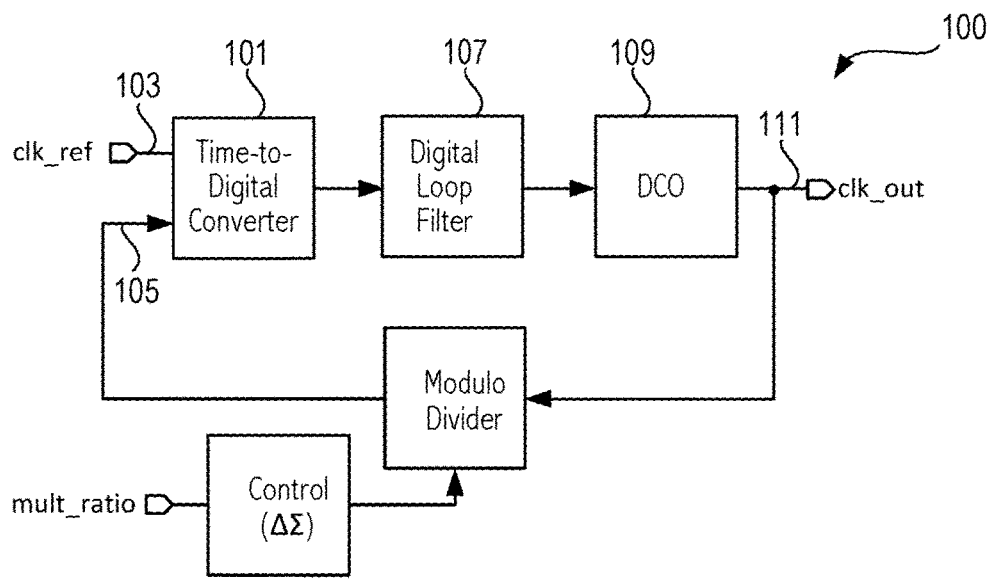
FIG. 1A illustrates a PLL that utilizes a time-to-digital converter.
Figure 1B:
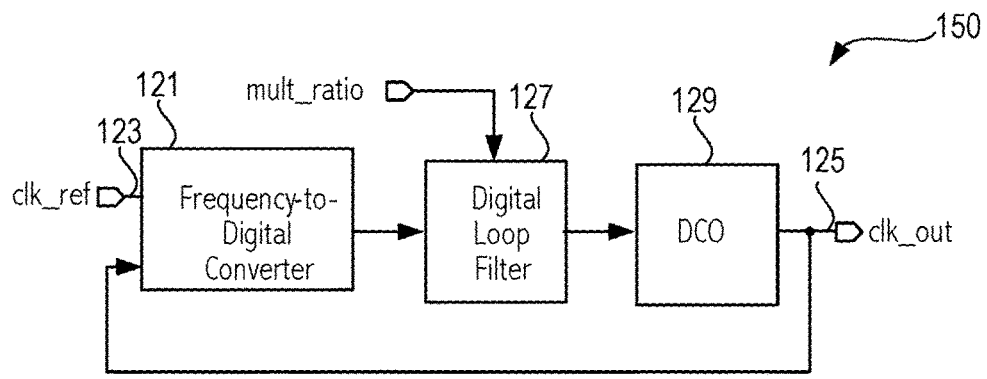
FIG. 1B illustrates a FLL that utilizes a frequency-to-digital converter.
Figure 2:
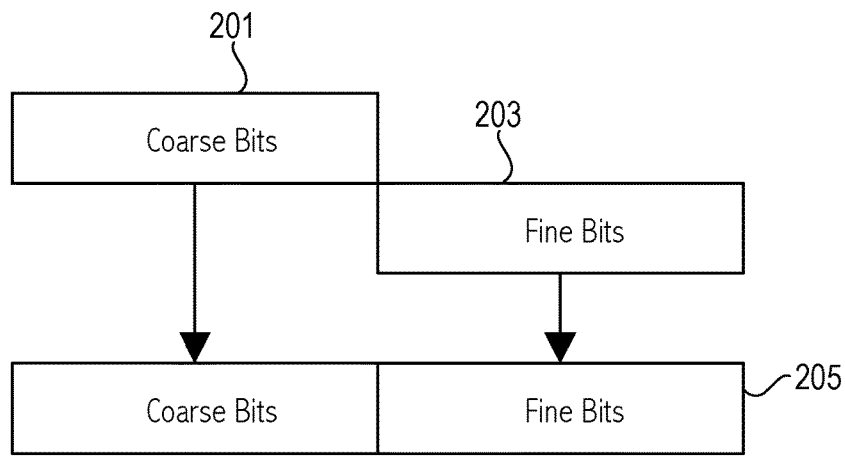
FIG. 2 illustrates how bits of a coarse TDC and a fine TDC may be concatenated without overlap.
Figure 3A:
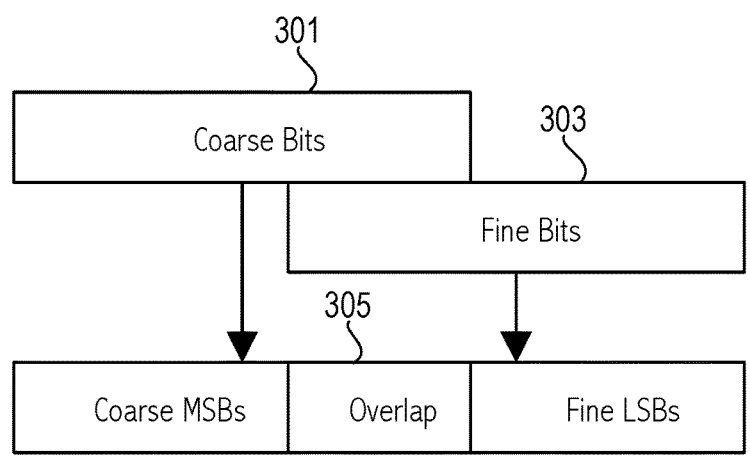
FIG. 3A illustrates how bits of a coarse TDC and a fine TDC may overlap.

Embodiments described herein use redundancy concepts for time and frequency quantizers. Redundancy means that there is overlap between the bits of the coarse quantizer and the fine quantizer. FIG. 2 illustrates how coarse bits 201 and fine bits 203 are concatenated in 205. However, offset between the coarse bits and the fine bits, as explained in more detail herein, cause the concatenated time representation to have errors. As explained in FIG. 3A, redundancy is used so that the coarse bits 301 and the fine bits 303 overlap. The overlapped portion 305 is corrected if needed and the concatenation takes place without offset error. Using redundancy in time circuits resolves a particularly troublesome issue with mismatch in the sampling time of two or more TDCs used in a sub-ranging TDC.

Figure 3B:
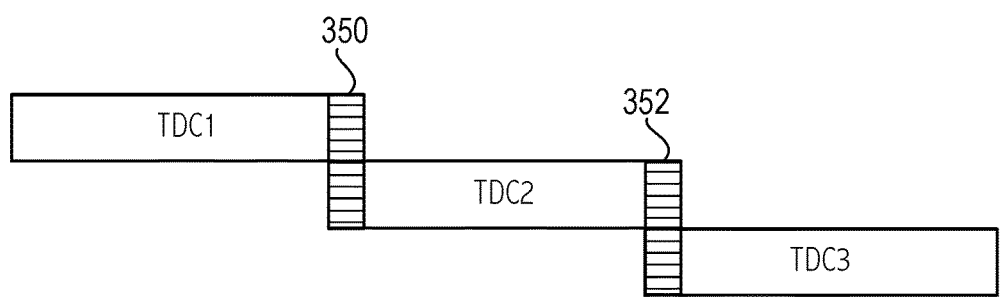
FIG. 3B illustrates a sub-ranging TDC with three ranges with overlapping regions.
Figure 4:
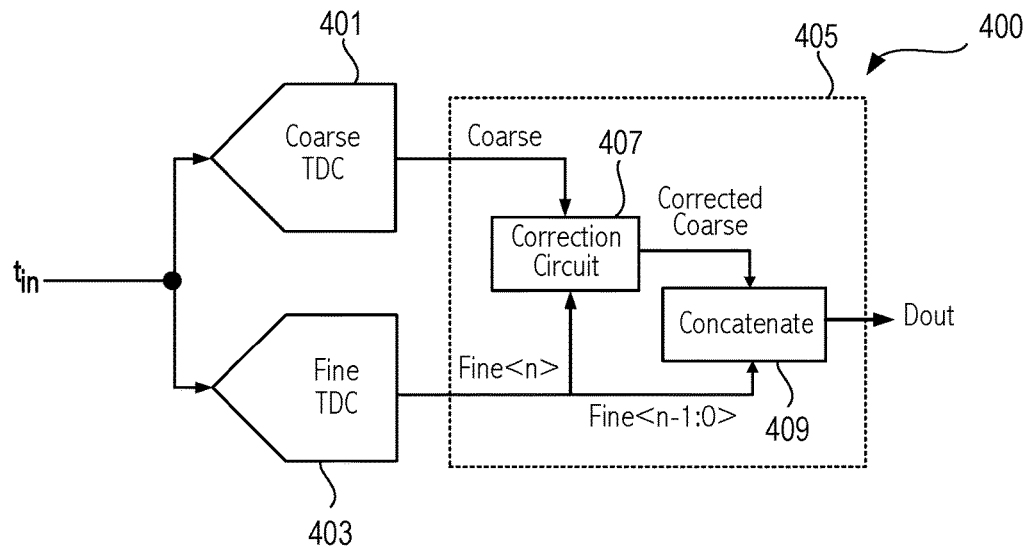
FIG. 4 illustrates a high level diagram of a sub-ranging TDC according to an embodiment that utilizes redundancy and correction to address mismatch.

FIG. 4 shows a high level diagram of a sub-ranging TDC 400 according to an embodiment. A sub-ranging TDC is a TDC that is composed of multiple "sub"-TDCs. The sub-TDCs have different resolutions and ranges so each sub-TDC is addressing a different "range of resolution." The fine/coarse TDC shown in FIG. 4 has two subranges, but other embodiments may have more than two subranges. For example, referring to FIG. 3B, three sub-TDCs (TDC1, TDC2, and TDC3) are shown that have redundancy (overlap) at 350 and 352 at the boundaries between the TDCs. Redundancy or overlap means that the overlap region of different TDCs represent the same information. Referring back to FIG. 4, the coarse TDC 401 and fine TDC 403 have at least some overlap in their outputs and the sub-ranging TDC 400 has a specialized "combiner" 405 that corrects for any mismatch between the coarse and fine TDC in correction circuit 407 and then concatenates the results in 409, rather than simply concatenating the two digital words.

Figure 5A:
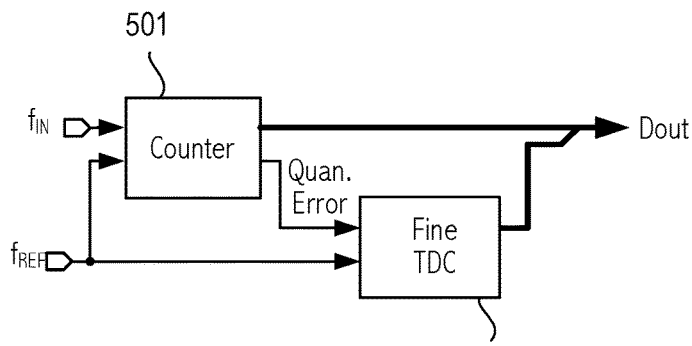
FIG. 5A illustrates an embodiment of a coarse TDC and a fine TDC.

FIG. 5A illustrates an embodiment of a coarse TDC 501 and a fine TDC 503. The coarse TDC is implemented in the embodiment of FIG. 5A as a counter and counts the clock periods of an input clock signal $f_{IN}$ that occur in a predetermined number of reference clock cycles $f_{REF}$, where the input clock $f_{IN}$ in this example has a higher frequency than the reference clock signal $f_{REF}$. The output of the counter 501 supplies the most significant bits (MSBs) of the digital representation of the frequency, which corresponds to the coarse representation. In addition, the fine TDC 503 supplies the least significant bits (LSBs) of the digital representation of the frequency, which corresponds to the fine representation. The results are then concatenated together. The fine TDC resolves at least some of the quantization error that occurs because the resolution of the counter is limited to a period of the clock used to count. That ideally results in a quantization error equal to the fine TDC's quantization error but with a range equal to the range of the counter. For ease of illustration, the combiner circuit is not shown in FIG. 5A.

Figure 5B:
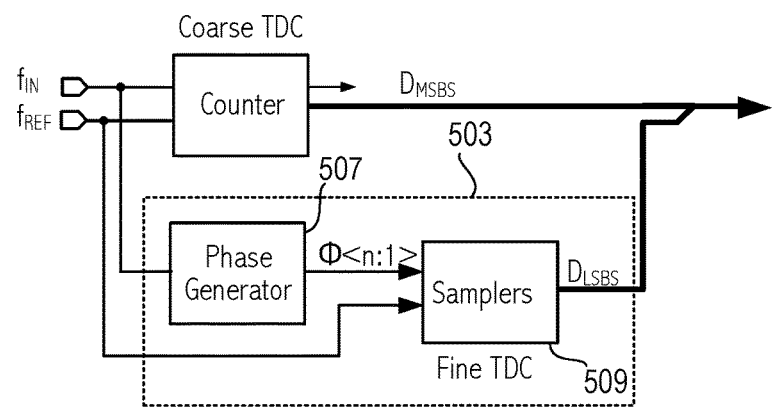
FIG. 5B illustrates an embodiment of a coarse TDC and a fine TDC in which the fine TDC utilizes a multiphase generator.

FIG. 5B illustrates one embodiment of a sub-ranging TDC in which the fine TDC 503 includes a multi-phase generator 507 that may be implemented as a delay-locked loop (DLL). In other embodiments, a PLL may be used. For ease of illustration, the combiner circuit is not shown in FIG. 5B. The time of an edge is quantized by measuring between which two phases the edge falls in the samplers 509. For example, if the multi-phase generator 507 produces 8 phases, then its output will be an integer from 0 to 7 inclusive. Without redundancy, one LSB of the coarse quantizer will be a step of 8. Normally, once the measured time extends beyond a coarse LSB, the coarse quantizer increments by one and the fine quantizer rolls back to zero, which makes a smooth step from 7 to 8 (0111 to 1000). However, if there is a one fine LSB time offset, then the quantizer (combined coarse and fine) might step from 6, 7, 0, and then 9. The offset can result, e.g., from the fine quantizer rolling back to zero before the coarse quantizer steps to the next value.

When redundancy is added, in this example by changing the phase generator to 16 phases, the phase generator steps 6, 7, 8, and 9 while the coarse quantizer reads 0, 0, 0, and 8. If the outputs were naively combined (with the fine MSB ignored), they would output 6, 7, 0, and 9 as in the previous case, but with redundancy the combiner (see 405 in FIG. 4) compares the LSB of the coarse quantizer with the MSB of the fine quantizer and makes a correction if the bits do not match. The table below shows the coarse LSB and the fine bits corresponding to example just given.

| Coarse LSB | Fine |
| --- | --- |
| 0 | 0110 |
| 0 | 0111 |
| 0 | 1000 |
| 1 | 1001 |

Note that for the example shown in the table the coarse LSB matches the fine MSB in every case except the third row of the table (0/1000), indicating a correction needs to be made. In this case, the correction is to add a fine MSB (a value of one) to the coarse LSB, which results in the 6, 7, 8, and 9 output desired.

FIG. 6 illustrates how the coarse and fine bits perform with no offset. As illustrated in FIG. 6, the resolution of the coarse TDC (value of 4) is less than a range of the fine TDC (0 to 7) such that coarse information and the fine information intentionally overlap. In the example of FIG. 6 the fine bits represent 0 to 7 and there is one bit of overlap. That is the LSB of the coarse bits corresponds to a value of 4. The coarse bits increment every four counts. In the example of FIG. 6 there is no offset and when the fine bits transition from 011 to 100, the LSB of the coarse bits transitions from 0 to 1. Similarly, when the fine bits roll over from a maximum value (111) to a minimum value (000), the LSB of the coarse bits transitions from 1 to 0 reflecting an increment in the value of the coarse bits. In contrast to a fine TDC that rolls over, some TDCs may saturate rather than rollover when the range of the fine TDC is exceeded.

FIG. 7 illustrates an offset condition in which the offset is a half of a fine LSB. The fine count is shown in the inner circle and the coarse LSB is shown in the outer circle. The fine quantizer steps from 011 to 100 at 701 before the coarse quantizer steps from 0 to 1 at 703. That results in an error when the outputs of the coarse and fine quantizers are concatenated together, which error (000) is shown in parentheses in the shaded portion 705. The concatenated value is the LSB of the coarse quantizer and the LSBs of the fine quantizer. The concatenated value would, absent correction, incorrectly reads 000 when the value should be 100. The fine quantizer also rolls over to zero at 707 before the coarse quantizer steps at 709. That results in an error shown in parenthesis the shaded portion 711, where the concatenated value would incorrectly read 100 instead of 000. Thus, the offset results in a TDC error unless there is correction, the error misrepresenting the digital value of the time (or frequency). That is, given the offset shown in FIG. 7, the TDC concatenated value incorrectly counts 0, 1, 2, 3, 0, 4, 5, 6, 7, 4, 8.

FIG. 8 illustrates the error associated with the offset of FIG. 7, where the incorrect values (4 and 0) by the TDC are shown in parenthesis in the shaded portions 801 and 803, respectively, where the incorrect values result from concatenating coarse quantizer LSB and fine quantizer LSBs. In FIG. 8 the numbers inside the inner circle represent the fine count (except for the number in parenthesis showing the concatenated value). The coarse LSB is shown between the inner and outer circle. In FIG. 8, the coarse LSB steps late at 802 and 804 with respect to the fine count. The correction applied in FIG. 8 adds a one to the coarse LSB when there is a difference between the overlapping bits (between the coarse LSB and the fine MSB). When the correction is applied, by adding a one to the coarse LSB, the corrected value provided by the concatenated bits of the TDC is shown in parenthesis in 805 and 807.

Figure 9:
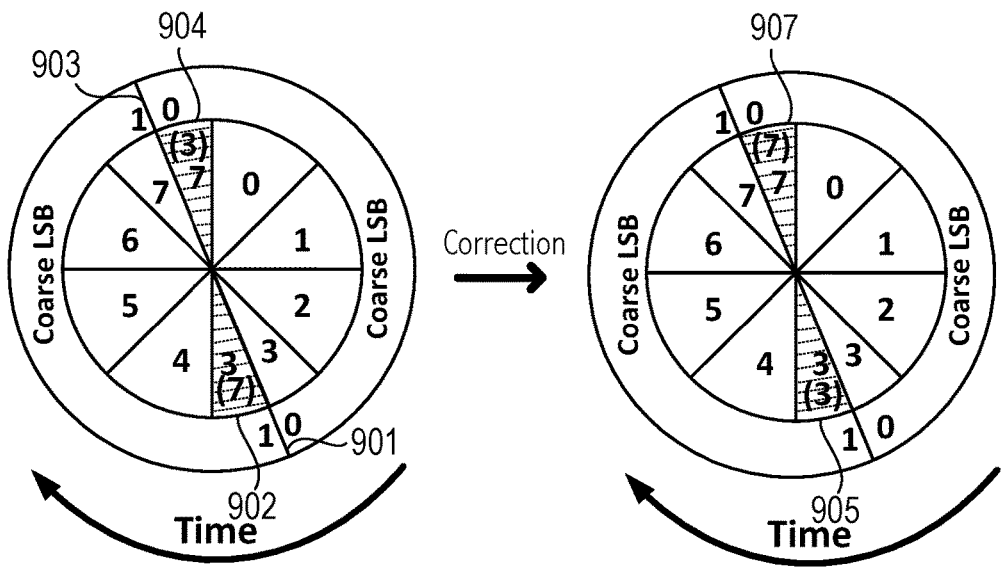
FIG. 9 illustrates a mismatch error that occurs when the coarse LSB transitions before the fine bits transition and the correction.

FIG. 9 illustrates an offset in which the coarse LSB steps early with respect to the fine count and the correction subtracts a one from the LSB of the coarse bits. Thus at 901, the coarse LSB steps early from 0 to 1 while the fine bits are still at 3. That results in an incorrect TDC concatenated output of 7 shown in parenthesis in the shaded portion 902, (where the concatenated output is the coarse LSB and the fine LSBs). By subtracting 1 from the coarse LSB, the correct concatenated output of 3 is shown in the shaded portion 905. At 903 the coarse LSB steps early from 1 to 0 resulting in the incorrect TDC concatenated output of 3 shown in parenthesis in the shaded portion 904. The correction subtracts a "1" from the LSB resulting in a TDC concatenated output value of 7 shown in parenthesis in the shaded portion 907 (assuming one or more of the coarse quantizer MSBs (bits other than the LSB) have a nonzero value when the correction is made). Otherwise, the value at 907 becomes −1 instead of 7.

Figure 10:
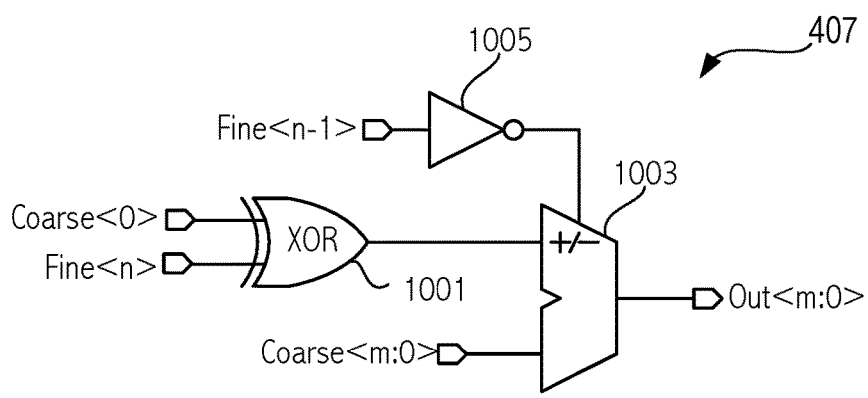
FIG. 10 illustrates an embodiment of a correction circuit that may be utilized to address mismatch.

FIG. 10 illustrates an embodiment of a correction circuit 407 that may be used in the combiner 405 (see FIG. 4). In this example there are n+1 fine bits (<n:0>) and m+1 coarse bits (<m:0>). An XOR gate 1001 compares the coarse LSB (Coarse<0>) and the fine MSB (Fine<n>). Those bits are overlapping and provide the needed redundancy. If the value of the bits differ, the XOR gate supplies a 1 to the summing circuit 1003 as the mismatch indication, which in the embodiment illustrated is also the value of the correction, where the summing circuit 1003 adds a +1 or a −1 to the coarse bits (Coarse<m:0>). The determination of whether to add or subtract (add+1 or −1) is based in the illustrated embodiment on the second most significant fine bit (Fine<n−1>). Referring to FIG. 8, when the TDC count is wrong, at 801 and 803, the value of the fine count is 000 and 100 respectively, and the second MSB is 0. That value is inverted in inverter 1005 causing the summing circuit 1003 to add the output of the XOR gate 1001 to the coarse bits to perform the correction. On the other hand, referring to FIG. 9, when the TDC count is wrong, at 902 and 904, the value of the fine count is 011 and 111 respectively, and the second fine MSB is 1. That value is inverted in inverter 1005 causing the summing circuit 1003 to subtract the output of the XOR gate 1001 from the coarse bits to provide the correction. Note that the addition/subtraction also occurs when the overlapping bits are the same but the output of the XOR gate in that case is zero so the value of the coarse bits is not changed by adding or subtracting zero.

While FIGS. 6-10 illustrate embodiments with one bit of overlap (coarse LSB and fine MSB), other embodiments can have an overlap region that represents any numerical value. In one embodiment, the overlap is two digital bits (two coarse LSBs and two fine MSBs). The overlap regions are compared and corrected if the overlap regions do not match. The correction is accomplished by adding or subtracting from the coarse LSBs to make the coarse LSBs match the fine MSBs. Addition is performed if the coarse LSBs transition late with respect to the transition of the fine MSBs. Subtraction is performed if the coarse LSBs transition early with respect to the transition of the fine MSBs. The amount of addition or subtraction is equal to the difference between the overlapping coarse LSBs and the fine MSBs.

Thus, various aspects have been described relating to correcting offset in time to digital converters. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:
1. An apparatus comprising:
 a fine time-to-digital converter (TDC) providing fine time information with a first resolution, wherein the fine TDC is configured to roll over from a maximum value to a minimum value;
 a coarse TDC providing coarse time information with a second resolution, the second resolution more coarse than the first resolution and the second resolution is less than a range of the fine TDC such that a first portion of the fine time information and a second portion of the coarse time information overlap and provide redundancy;
 a compare circuit to compare the first portion of the fine time information and the second portion of the coarse time information and supply a mismatch indication in response to the first portion and the second portion not matching; and a correction circuit to correct the second portion responsive to the mismatch indication.

2. The apparatus as recited in claim 1, wherein the correction circuit adds to or subtracts from the second portion responsive to the compare circuit supplying the mismatch indication.

3. The apparatus as recited in claim 1, wherein the correction circuit adds to the second portion if the second portion transitions late with respect to the first portion and the correction circuit subtracts from the second portion if the second portion transitions early with respect to the first portion.

4. The apparatus as recited in claim 2, wherein an overlapping portion formed by the first portion and the second portion corresponds to a value of N, where N is an integer.

5. The apparatus as recited in claim 1, wherein the first portion is a most significant bit of the fine time information and the second portion is a least significant bit of the coarse time information.

6. The apparatus as recited in claim 5 wherein the correction circuit adds to or subtracts from the least significant bit responsive to the compare circuit supplying the mismatch indication.

7. The apparatus as recited in claim 6, wherein the correction circuit adds a one to the least significant bit responsive to the compare circuit supplying the mismatch indication and a second most significant bit of the fine time information is a zero.

8. The apparatus as recited in claim 6, wherein the correction circuit subtracts a one from the least significant bit responsive to the compare circuit supplying the mismatch indication and a second most significant bit of the fine time information is a one.

9. The apparatus as recited in claim 2, wherein the fine time information and the coarse time information are concatenated after the correction circuit.

10. The apparatus as recited in claim 1 further comprising a phase generator wherein the phase generator provides N phases, N being an integer of at least four and the fine time information represents one of the N phases and the fine time information rolls over to zero when the fine time information goes from an Nth phase to a first phase of the N phases and wherein the fine time-to-digital converter quantizes a time of an arrival of an edge of a signal using the N phases.

11. A method comprising:
providing fine time information from a fine time-to-digital converter that rolls over from a maximum value to a minimum value;
providing coarse time information from a coarse time-to-digital converter;
comparing a first portion of the fine time information and a second portion of the coarse time information and supplying a mismatch indication in response to the first portion and the second portion not being equal, wherein the first portion and the second portion overlap; and
correcting the second portion responsive to the mismatch indication.

12. The method as recited in claim 11, wherein the first and second portions correspond to a value of N, where N is an integer.

13. The method as recited in claim 11, wherein the correcting further comprises adding to or subtracting from the second portion responsive to the mismatch indication.

14. The method as recited in claim 11, wherein the first portion is a most significant bit of the fine time information and the second portion is a least significant bit of the coarse time information.

15. The method as recited in claim 11, wherein the correcting further comprises adding to or subtracting from a least significant bit of the coarse time information responsive to the mismatch indication.

16. The method as recited in claim 15, further comprising adding a one to the least significant bit responsive to the mismatch indication and a second most significant bit of the fine time information being a zero.

17. The method as recited in claim 15, further comprising subtracting a one from the least significant bit responsive to the mismatch indication and a second most significant bit of the fine time information being a one.

18. The method as recited in claim 15, further comprising concatenating the fine time information and the coarse time information after correction to the coarse time information.

19. The method as recited in claim 11, further comprising:
generating the fine time information by quantizing a time of arrival of an edge of a signal with respect to a plurality of phases of a clock signal.

20. A sub-ranging time-to-digital converter comprising:
a fine time-to-digital converter providing fine time information;
a coarse time-to-digital converter providing coarse time information;
a compare circuit to compare a most significant bit of the fine time information and a least significant bit of the coarse time information and supply a mismatch indication in response to the most significant bit and the least significant bit not being equal, wherein the most significant bit and the least significant bit overlap and provide redundancy; and
a correction circuit to correct the least significant bit of the coarse time information responsive to the mismatch indication.

* * * * *